(12) United States Patent
Ogata et al.

(10) Patent No.: US 11,448,619 B2
(45) Date of Patent: Sep. 20, 2022

(54) SUBSTANCE DETECTING ELEMENT

(71) Applicant: DAI-ICHI SEIKO CO., LTD., Kyoto (JP)

(72) Inventors: Kenji Ogata, Ogori (JP); Shogo Kurogi, Ogori (JP)

(73) Assignee: DAI-ICHI SEIKO CO., LTD., Kyoto (JP)

(*) Notice: Subject to any disclaimer, the term of this patent is extended or adjusted under 35 U.S.C. 154(b) by 312 days.

(21) Appl. No.: 16/483,344

(22) PCT Filed: Mar. 16, 2018

(86) PCT No.: PCT/JP2018/010449
§ 371 (c)(1),
(2) Date: Aug. 2, 2019

(87) PCT Pub. No.: WO2018/180589
PCT Pub. Date: Oct. 4, 2018

(65) Prior Publication Data
US 2021/0278377 A1    Sep. 9, 2021

(30) Foreign Application Priority Data
Mar. 31, 2017 (JP) .............................. JP2017-070353

(51) Int. Cl.
*G01N 29/22* (2006.01)
*G01N 29/02* (2006.01)
(Continued)

(52) U.S. Cl.
CPC ......... *G01N 29/222* (2013.01); *G01N 29/022* (2013.01); *G01N 29/036* (2013.01);
(Continued)

(58) Field of Classification Search
CPC .. G01N 29/222; G01N 29/022; G01N 29/036; G01N 29/2437; G01N 2291/014;
(Continued)

(56) References Cited

U.S. PATENT DOCUMENTS

| 5,719,324 A | 2/1998 | Thundat et al. |
| 2003/0042907 A1* | 3/2003 | Kieres .................... G01R 29/12 |
| | | 324/458 |

(Continued)

FOREIGN PATENT DOCUMENTS

| CN | 101802586 A | 8/2010 |
| CN | 102269615 A | 12/2011 |

(Continued)

OTHER PUBLICATIONS

International Search Report and Written Opinion (International Application No. PCT/JP2018/010449); dated Jun. 12, 2018; 4 pages.

(Continued)

*Primary Examiner* — Tarun Sinha
(74) *Attorney, Agent, or Firm* — Howard & Howard Attorneys PLLC

(57) ABSTRACT

A through-hole (3) is disposed in a supporting substrate (2). Plate-shaped beams (4 (4A, 4B)) each includes a piezoelectric element, extends from an edge of the through-hole (3) toward an opposite edge to close a part of the through-hole (3), supports a substance adsorption film to which a constitutive substance to be detected adheres, and has a vibration frequency that is varied due to adhesion of the constitutive substance to the substance adsorption film. Drive electrodes (16) apply a voltage to the piezoelectric element to vibrate and deform the beams (4). Detection electrodes (17) detect information about the vibration frequencies of the beams (4).

11 Claims, 11 Drawing Sheets

(51) Int. Cl.
*G01N 29/036* (2006.01)
*G01N 29/24* (2006.01)
*H01L 41/09* (2006.01)

(52) U.S. Cl.
CPC ..... *G01N 29/2437* (2013.01); *H01L 41/0986* (2013.01); *G01N 2291/014* (2013.01); *G01N 2291/021* (2013.01); *G01N 2291/0256* (2013.01); *G01N 2291/02809* (2013.01)

(58) Field of Classification Search
CPC ..... G01N 2291/0256; G01N 2291/021; G01N 2291/02809
USPC ....................................................... 73/24.06
See application file for complete search history.

(56) References Cited

U.S. PATENT DOCUMENTS

| | | | | |
|---|---|---|---|---|
| 2010/0000292 | A1* | 1/2010 | Karabacak | G01N 29/022 73/24.01 |
| 2010/0186487 | A1 | 7/2010 | Sakashita | |
| 2012/0270352 | A1* | 10/2012 | Huffman | H02N 1/002 438/50 |
| 2014/0305191 | A1 | 10/2014 | Schmid et al. | |
| 2014/0352447 | A1 | 12/2014 | Yoshikawa et al. | |
| 2015/0301075 | A1* | 10/2015 | Yamanaka | B81B 3/0072 73/1.38 |

FOREIGN PATENT DOCUMENTS

| | | |
|---|---|---|
| CN | 204944974 U | 1/2016 |
| JP | 2006-069112 A | 3/2006 |
| JP | 2006-220546 A | 8/2006 |
| JP | 2007-240252 A | 9/2007 |
| JP | 2009-204584 A | 9/2009 |
| JP | 2010-032389 A | 2/2010 |
| JP | 2010-078333 A | 4/2010 |
| WO | 2013/157581 A1 | 10/2013 |

OTHER PUBLICATIONS

Yoshikawa et al.; Two Dimensional Array of Piezoresistive Nanomechanical Membrane-Type Surface Stress Sensor (MSS) with Improved Sensitivity; Sensors 2012; Published: Nov. 16, 2012; 16 pages.

Extended European Search Report (EP Application No./Patent No. 18776794.2-1020 / 3605057); dated Mar. 3, 2020; 10 pages.

Japanese Office Action dated Jan. 4, 2022, issued in corresponding Japanese Patent Application No. 2021-062972 along with English language translation; 10 pages.

English language abstract and machine-assisted English language translation of Japanese Patent Publication No. 2006-069112 A extracted from www.espacenet.com on Jan. 8, 2022; 44 pages.

Chinese language Office Action from Chinese Patent Application No. 201880020078.6 dated Jun. 29, 2021; 8 pages.

English language abstract of later publication, and machine-assisted English language translation of Chinese Patent Application No. CN1 02269615 A downloaded from www.espacenet.com on Jun. 29, 2021; 12 pages.

English language abstract of Chinese Patent Publication No. CN 101802586 A extracted from www.espacenet.com on Jun. 29, 2021; See English language equivalent U.S. Patent Publication No. 2010/0186487 A1; 2 pages.

English language abstract, and machine-assisted English language translation of Chinese Patent Publication No. CN 204944974 U extracted from www.espacenet.com on Jul. 26, 2021; 9 pages.

English language abstract, and machine-assisted English language translation of Japanese Patent Publication No. JP 2006-220546 A extracted from www.espacenet.com on Jun. 29, 2021; 30 pages.

* cited by examiner

FLOW OF GAS

SUBSTANCE DETECTING ELEMENT

CROSS-REFERENCE TO RELATED APPLICATIONS

This application is a national phase of International Patent Application No. PCT/JP2018/010449, filed Mar. 16, 2018, which claims priority to JP Patent Application No. 2017-070353, filed Mar. 31, 2017, the disclosure of which is hereby incorporated by reference in its entirety.

TECHNICAL FIELD

The present disclosure relates to a substance detecting element.

BACKGROUND ART

Patent Literature 1 discloses a chemical sensor device which is used for identifying a substance on the basis of variations in the resonance frequencies of vibrators, occurring when the substance is adsorbed or desorbed. The chemical sensor device includes the vibrators exhibiting the different properties of the desorption and adsorption of the substance, wherein each of the vibrators includes a piezoelectric substrate. Application of an alternating voltage allows such piezoelectric substrates to be deformed, thereby vibrating the vibrators. The substance can be identified by specifying a vibrator with a varying resonance frequency.

CITATION LIST

Patent Literature

Patent Literature 1: Unexamined Japanese Patent Application Kokai Publication No. 2009-204584

SUMMARY OF INVENTION

Technical Problem

In the chemical sensor device disclosed in the above Patent Literature 1, the vibrators are merely two-dimensionally arrayed on a flat plate but are not efficiently arranged to help each vibrator to adsorb a substance included in air. In such a configuration, the flat plate in itself may block airflow, thereby deteriorating the efficiency of adsorption of a substance, of each vibrator.

The present disclosure was made under such actual circumstances with an objective to provide a substance detecting element that is capable of more efficiently detecting a substance.

In order to achieve the aforementioned objective, a substance detecting element according to the present disclosure includes:

a supporting substrate in which a through-hole is disposed;

a plate-shaped beam that includes a piezoelectric element, the beam extending from an edge of the through-hole toward an opposite edge to close a part of the through-hole and supporting a substance adsorption film to which a substance to be detected adheres, and the beam having a vibration frequency that is varied due to adhesion of the substance to the substance adsorption film;

a drive electrode that applies a voltage to the piezoelectric element to vibrate and deform the beam; and a detection electrode that detects information about a vibration frequency of the beam.

In this configuration, the beam may be fixed to at least two edges of the through-hole.

The beam may include a plate-shaped first beam having at least one end fixed to an edge of the through-hole and provided with the drive electrode and a plate-shaped second beam having at least one end fixed to an edge of the through-hole and provided with the detection electrode, the second beam intersecting the first beam.

Both the ends of the first beam fixed to edges of the through-hole may be provided with the drive electrodes, both the ends of the second beam fixed to edges of the through-hole may be provided with the detection electrodes, and the first beam and the second beam may be coupled to each other at respective middles of the first beam and the second beam.

The width of a coupling portion of the first beam and the second beam may be set to be wider than widths of portions of the first beam and the second beam other than the coupling portion.

A width of the first beam may be set to be wider than a width of the second beam.

The first beam and the second beam may be orthogonal to each other.

A lead wire that connects the detection electrodes formed on both the ends of the second beam may be formed on the second beam, and a lead wire that is electrically connected to one of the detection electrodes may be drawn to outside of the second beam.

The lead wires that are electrically connected to the respective drive electrodes formed on both the ends of the first beam may be drawn to outside of the first beam and unified into one.

A plurality of the through-holes may be disposed in the supporting substrate, each of the plurality of the through-holes may be provided with the beam, and each beam may support a different kind of the substance adsorption film.

Solution to Problem

Advantageous Effects of Invention

According to the present disclosure, a through-hole through which gas including a substance passes is provided with a substance adsorption film, such a configuration is made that gas including a substance to be detected is helped to pass through the periphery of the substance adsorption film, and therefore, the substance can be more efficiently detected.

DESCRIPTION OF EMBODIMENTS

An embodiment of the present disclosure will be described in detail below. A substance detecting element according to the present embodiment is produced using micro electro mechanical systems (MEMS) which are semiconductor production technology that realizes micro processing.

Figure 1:
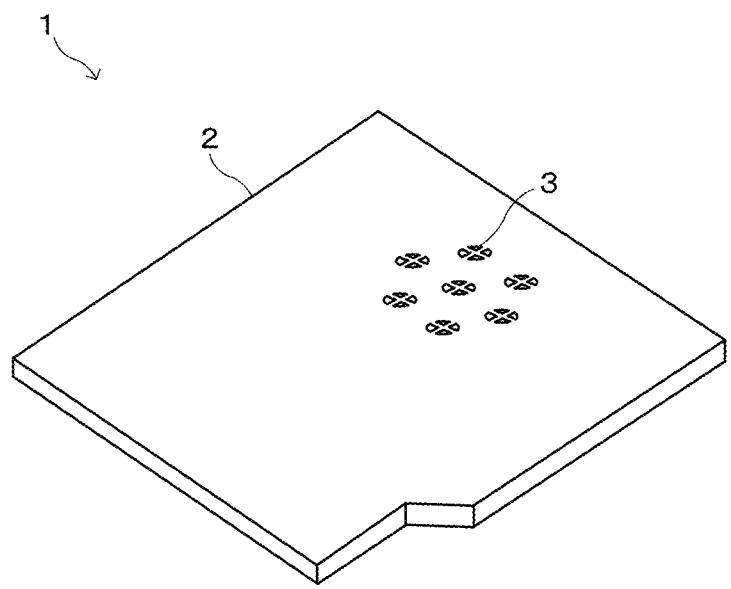
FIG. 1 is a perspective view of a substance detecting element according to Embodiment 1 of the present disclosure.

As illustrated in FIG. 1, a substance detecting element 1 according to the present embodiment includes a supporting substrate 2 having a generally rectangular flat-plate shape. The supporting substrate 2 is produced from, for example, a silicon-on-insulator (SOI) substrate. The SOI substrate, which is a semiconductor substrate with a layered structure, including a BOX layer which is a buried oxide layer and a silicon (SOI) layer which is a semiconductor layer on the BOX layer, is a wafer containing an oxide film.

Figure 2:
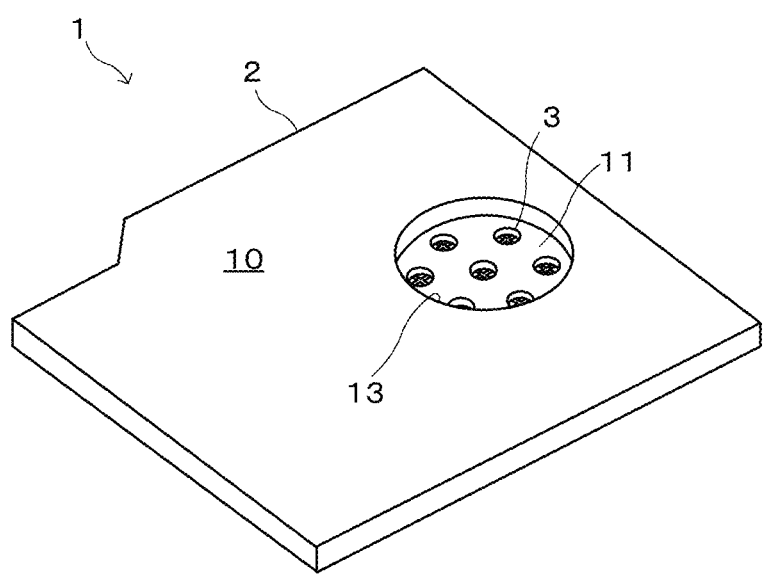
FIG. 2 is a perspective view of the substance detecting element of FIG. 1, viewed from the opposite side.

The supporting substrate 2 is configured by layering a Si supporting layer 11 including a BOX layer formed of a substrate wafer and a buried oxide layer on a base 10 including a resin, as illustrated in FIG. 1 and FIG. 2. A Si active layer 12 (see FIG. 6A and FIG. 6B) which is an element wafer active layer is layered on the Si supporting layer 11.

An opening 13 having a circular shape is disposed in a part of the base 10 of the supporting substrate 2, and the Si supporting layer 11 is exposed in a portion corresponding to the opening 13. Seven through-holes 3 are disposed in the Si supporting layer 11 and the Si active layer 12 in the portion corresponding to the opening 13. The through-holes 3 have a circular shape and each have the same diameter.

Figure 3:
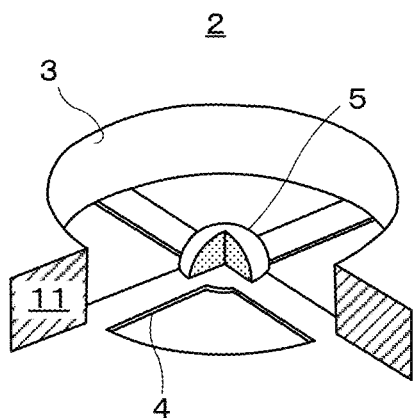
FIG. 3 is a perspective view illustrating the partly crushed periphery of a through-hole.
Figure 4:
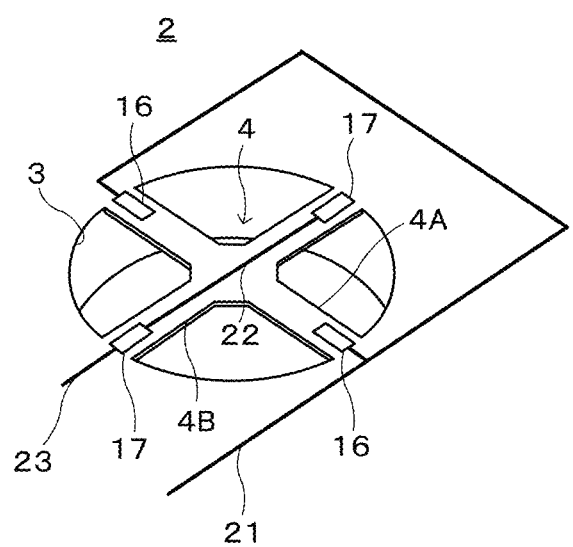
FIG. 4 is an enlarged perspective view of the vicinity of a through-hole.

As illustrated in FIG. 3 and FIG. 4, each of the through-holes 3 is provided with a pair of plate-shaped beams 4. The pair of beams 4 includes a drive beam (first beam) 4A having a linear plate shape and a detection beam (second beam) 4B having a linear plate shape. Each of the beams 4 (the drive beam 4A and the detection beam 4B) includes a portion that is formed of the Si active layer 12 and extends from an edge toward an opposite edge.

The drive beam 4A and the detection beam 4B are orthogonal to each other and are coupled to each other at the middles of the drive beam 4A and the detection beam 4B. In the present embodiment, the width of the drive beam 4A and the width of the detection beam 4B are equal to each other. The widths indicate the length of the drive beam 4A in a lateral direction and the length of the detection beam 4B in a lateral direction. The pair of beams 4 does not close the whole of each through-hole 3 but closes a part of each through-hole 3. Thus, the beams 4 prevent gas from remaining in each through-hole 3 to help the gas to pass through each through-hole 3.

As illustrated in FIG. 3, the beams 4 support a substance adsorption film 5 that adsorbs a substance to be detected. The substance adsorption film 5 is located at the middles of the beams 4, that is, the center in each through-hole 3, and is disposed on the coupling portion of the drive beam 4A and the detection beam 4B. The width of one beam 4 in the lateral direction and the width of the other beam 4 in the lateral direction, at the middles of the beams 4, that is, the portion at which the beams 4 in the pair are coupled to each other and on which the substance adsorption film 5 is formed, are set to be wider than those of the portions of the beams 4 other than the coupled portion. In addition, the substance adsorption film 5 has a dome shape (hemispheric shape). Therefore, the substance adsorption film 5 can have an increased surface area exposed to gas and therefore, more easily adsorb the substance to be detected, included in gas (for example, in air).

The substance to be detected is a gaseous substance (hereinafter referred to as "constitutive substance") constituting, for example, a chemical substance to be detected, included in air, in, for example, a chemical substance group (odor factor) constituting an odor. Examples of the chemical substance to be detected include an odor causative substance having a specific odor, such as ammonia, mercaptan, aldehyde, hydrogen sulfide, or amine. After a lapse of a certain period of time following the adsorption of a constitutive substance constituting an odor causative substance, the adsorbed constitutive substance is separated, and therefore, the substance adsorption film 5 can be reused.

The beams 4 are configured so that a vibration frequency (for example, a resonance frequency) is varied when the substance adsorption film 5 adsorbs the constitutive substance. Since the substance adsorption film 5 is arranged in each through-hole 3 which is an opening through which gas including the constitutive substance passes, the substance adsorption film 5 is helped to adsorb the constitutive substance included in the gas. In order to prevent the vibrations of the beams 4 from being affected by the vibration of an apparatus (for example, an electronic instrument 50 described below) into which the substance detecting element 1 is incorporated, the vibration frequencies of the beams 4 are desirably set to be different from and to be higher than the vibration frequency of the apparatus.

As illustrated in FIG. 4, drive electrodes 16 in a pair are formed on both ends of the drive beam 4A, and detection electrodes 17 in a pair are formed on both ends of the detection beam 4B. In addition, a drive signal wire 21, an interelectrode signal wire 22, and a detection signal wire 23 as lead wires are formed on the supporting substrate 2 and the beams 4. The drive signal wire 21 is connected to the drive electrodes 16. In addition, the interelectrode signal wire 22 connects the detection electrodes 17 to each other on the detection beam 4B. The detection signal wire 23 is connected to one detection electrode 17.

A voltage signal that drives the beams 4 is applied to the drive electrodes 16 through the drive signal wire 21. In addition, a voltage signal generated from one detection electrode 17 by the vibrations of the beams 4 is sent to the other detection electrode 17 through the interelectrode signal wire 22. In addition, voltage signals from the detection electrodes 17 in the pair are collectively output through the detection signal wire 23.

Figure 5:
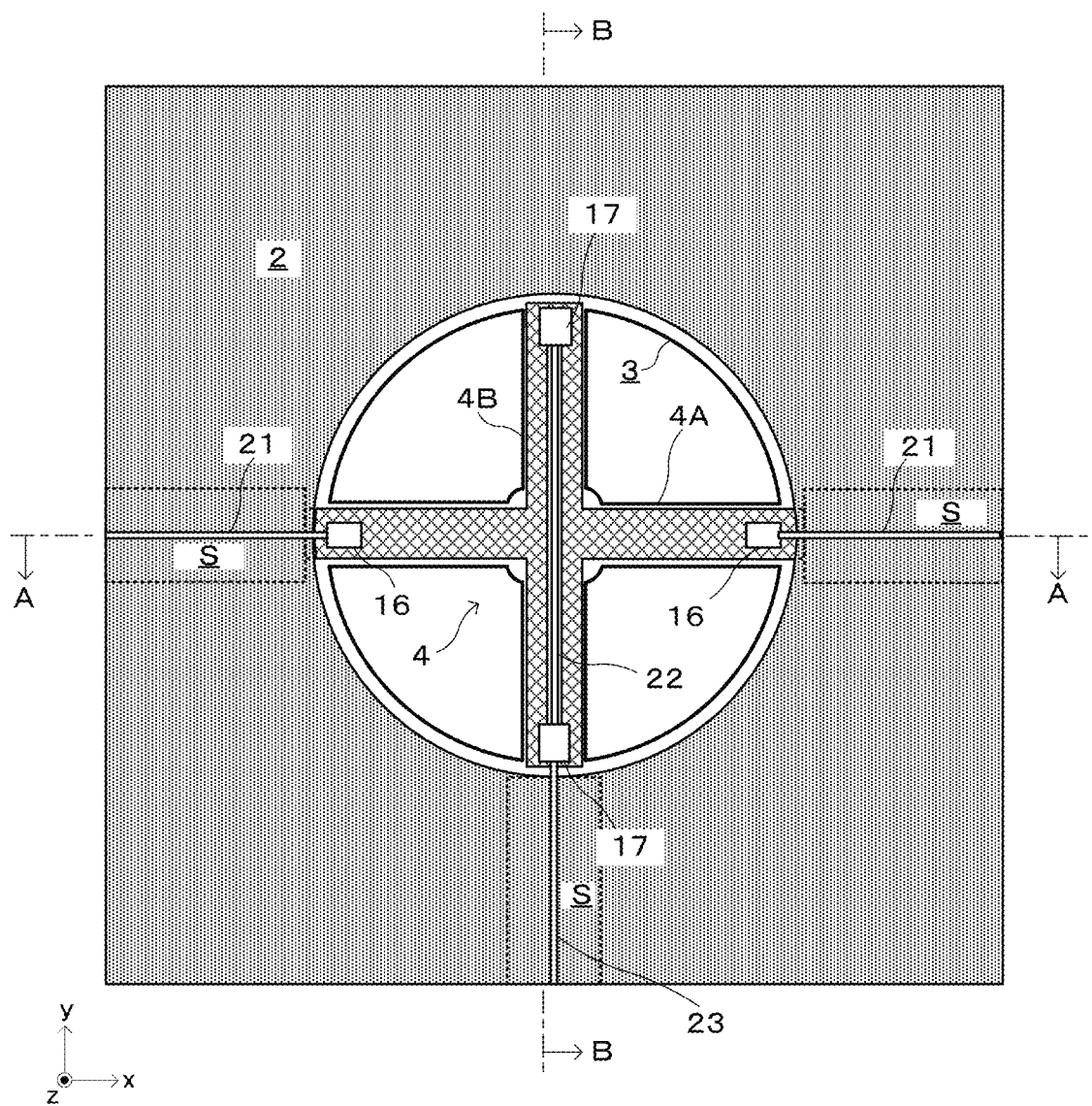
FIG. 5 is a top view of the vicinity of a through-hole.
Figure 6A:
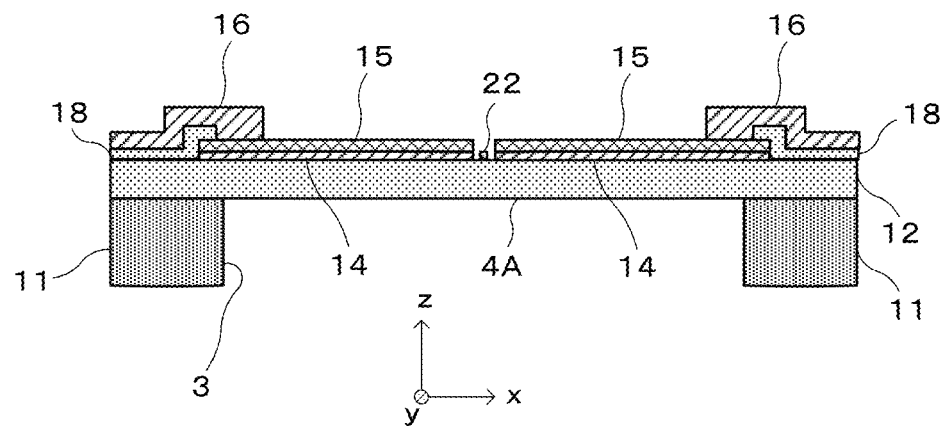
FIG. 6A is a cross-sectional view of a drive beam cut in a longitudinal direction.

As illustrated in FIG. 6A which is a cross-sectional view taken along the line A-A of FIG. 5, the drive beam 4A principally includes the Si active layer 12 of the supporting substrate 2. A lower electrode layer 14 is formed on the Si active layer 12, and a piezoelectric element 15 is formed on the lower electrode layer 14. In the middle of the drive beam 4A, the lower electrode layer 14 and the piezoelectric element 15 are removed to pass the interelectrode signal wire 22. An insulating layer which is not illustrated is disposed between the interelectrode signal wire 22 and the Si active layer 12. In FIG. 6A, the illustration of the BOX layer is omitted.

The lower electrode layer 14 includes a conductive material (for example, a metal such as aluminum or copper). The same applies to the drive electrodes 16 and the detection electrodes 17. The piezoelectric element 15 includes, for example, a material (material exhibiting piezoelectric properties) such as lead zirconate titanate (PZT). The piezoelectric element 15 has a property of extending and contracting in a longitudinal direction (direction orthogonal to a thickness direction) when a voltage having a predetermined polarity is applied in the thickness direction.

As illustrated in FIG. 6A, the drive electrodes 16 in the pair are formed on the piezoelectric element 15 at the edge portions of each through-hole 3. A piezoelectric layer is formed of the lower electrode layer 14, the piezoelectric element 15, and the drive electrodes 16. The drive electrodes 16 and the lower electrode layer 14 vibrate and deform the drive beam 4A which applies a voltage to the piezoelectric element 15.

Figure 7A:
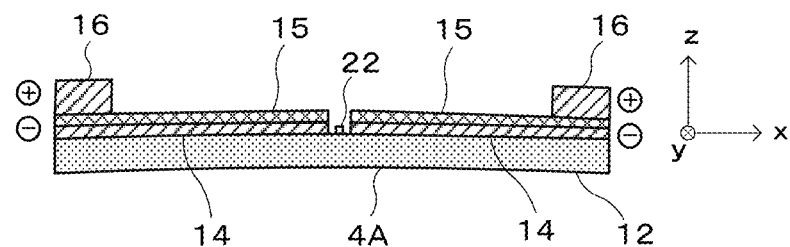
FIG. 7A is a view illustrating a state (1) in which the drive beam is deformed.

More specifically, a stress is applied to the piezoelectric layer in the direction of extending in a longitudinal direction (direction along the x axis) and extending in a surface direction (direction along the y axis) by applying a voltage having a polarity that allows the drive electrodes 16 to be positive and the lower electrode layer 14 to be negative (hereinafter referred to as "positive polarity"), as illustrated in FIG. 7A. As a result, a face, on which the lower electrode layer 14 is formed, of the Si active layer 12 extends, and the drive beam 4A is warped in an upwardly convex manner (in the +z direction).

Figure 7B:
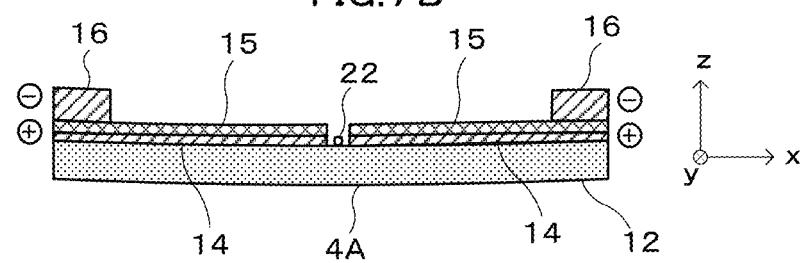
FIG. 7B is a view illustrating a state (2) in which the drive beam is deformed.

In contrast, a stress is applied to the piezoelectric layer in the direction of contracting in the longitudinal direction (direction along the x axis) and contracting in the surface direction (direction along the y axis) by applying a voltage having a polarity that allows the drive electrodes 16 to be negative and the lower electrode layer 14 to be positive (hereinafter referred to as "negative polarity"), as illustrated in FIG. 7B. As a result, the face, on which the lower electrode layer 14 is formed, of the Si active layer 12, contracts, and the drive beam 4A is warped in a downwardly convex manner (in the −z direction).

It will be appreciated that a piezoelectric element may be used that has the properties of contracting in the longitudinal direction by applying a voltage between both the drive electrodes 16 and the lower electrode layer 14 so as to allow a side closer to the drive electrodes 16 to be positive and a side closer to the lower electrode layer 14 to be negative, and of extending in the longitudinal direction by applying a voltage between both the drive electrodes 16 and the lower electrode layer 14 so as to allow the side closer to the drive electrodes 16 to be negative and the side closer to the lower electrode layer 14 to be positive. In such a case, application of a voltage having a positive polarity results in downwardly convex warpage while application of a voltage having a negative polarity results in upwardly convex warpage. As described above, the drive beam 4A may be bent and vibrated due to the extension and contraction of the piezoelectric layer.

In any case, a deformation illustrated in FIG. 7A or FIG. 7B can be caused by applying a voltage having a predetermined polarity between the drive electrodes 16 and the lower electrode layer 14. The degree of the deformation depends on the value of an applied voltage. A polarization action varies according to a material included in the piezoelectric element (according to, for example, a bulk or a thin film), and therefore, the polarity of the voltage and the relationship of extension and contraction may reverse with respect to the foregoing.

Figure 6B:
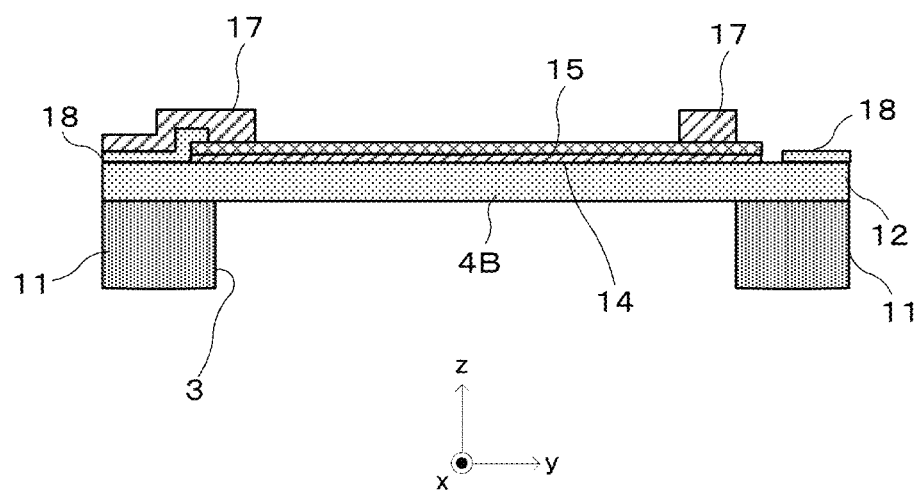
FIG. 6B is a cross-sectional view of a detection beam cut in a longitudinal direction.

In contrast, the detection electrodes 17 in the pair are formed at the edges of each through-hole 3, on the detection beam 4B, to come into contact with the piezoelectric element 15, as illustrated in FIG. 6B which is a cross-sectional view taken along the line B-B of FIG. 5. A piezoelectric layer is formed of the lower electrode layer 14, the piezoelectric element 15, and the detection electrodes 17. When the detection beam 4B is vibrated due to the vibration of the drive beam 4A described above, the piezoelectric element 15 included in the detection beam 4B is deformed, and a potential difference is generated between the detection electrodes 17 and the lower electrode layer 14. In FIG. 6A, the illustration of the BOX layer is omitted.

Figure 8A:
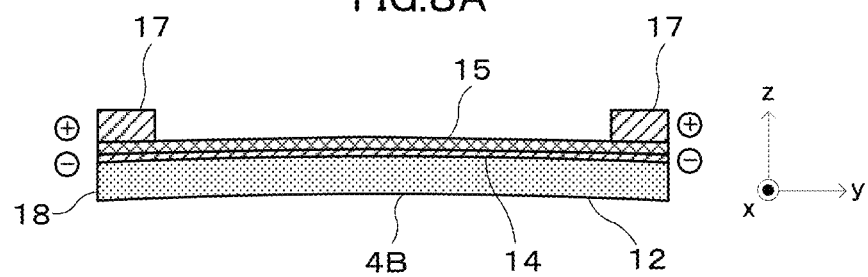
FIG. 8A is a view illustrating a state (1) in which the detection beam is deformed.

More specifically, a stress is applied to the piezoelectric layer in the direction of extending in a longitudinal direction (direction along the y axis) and extending in a surface direction (direction along the x axis) when the detection beam 4B is warped in an upwardly convex manner (in the +z direction), as illustrated in FIG. 8A. As a result, a voltage having a polarity that allows the detection electrodes 17 to be positive and the lower electrode layer 14 to be negative (hereinafter referred to as "positive polarity") is generated.

Figure 8B:
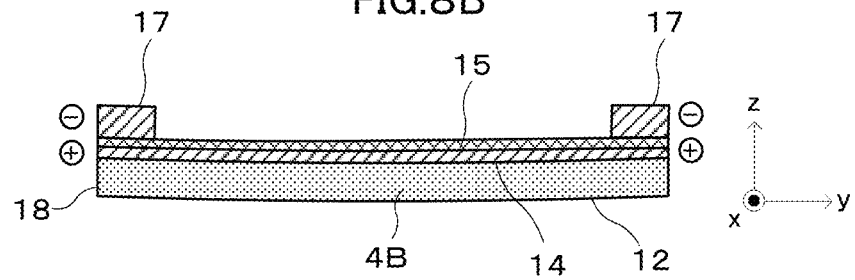
FIG. 8B is a view illustrating a state (2) in which the detection beam is deformed.

In contrast, a stress is applied to the piezoelectric layer in the direction of contracting in the longitudinal direction (direction along the y axis) and contracting in the surface direction (direction along the x axis) when the detection beam 4B is warped in a downwardly convex manner (in the −z direction), as illustrated in FIG. 8B. As a result, a voltage having a polarity that allows the detection electrode 17 to be negative and the lower electrode layer 14 to be positive (hereinafter referred to as "negative polarity") is generated.

It will be appreciated that a piezoelectric element may be used that has properties in which contraction in a longitudinal direction results in occurrence of a potential difference that allows a side closer to the detection electrodes 17 to be positive and a side closer to the lower electrode layer 14 to be negative while extension in the longitudinal direction results in occurrence of a potential difference that allows the side closer to the detection electrodes 17 to be negative and the side closer to the lower electrode layer 14 to be positive. In such a case, warpage in a downwardly convex manner results in generation of a voltage having a positive polarity while warpage in an upwardly convex manner results in generation of a voltage having a negative polarity. As described above, the detection beam 4B may be bent, thereby resulting in extension and contraction of the piezoelectric layer and in generation of a voltage.

In any case, occurrence of a deformation illustrated shown in FIG. 8A or FIG. 8B can result in generation of a voltage having a predetermined polarity between the detection electrodes 17 and the lower electrode layer 14. The magnitude of the voltage depends on the detection beam 4B. A polarization action varies according to a material included in the piezoelectric element (according to, for example, a bulk or a thin film), and therefore, the relationship between the extension and contraction and the polarity of the voltage may reverse with respect to the foregoing.

For example, when a sinusoidally varying voltage is applied between the drive electrodes 16 and the lower electrode layer 14, the drive beam 4A is sinusoidally vibrated. In response to the vibration of the drive beam 4A, the detection beam 4B is also vibrated. When the detection beam 4B is vibrated, a sinusoidally varying potential difference is generated between the drive electrodes 16 and the lower electrode layer 14.

In addition, when the frequency of a sinusoidal voltage applied between the drive electrodes 16 and the lower electrode layer 14 is increased or decreased, the frequencies of the vibrations of the drive beam 4A and the detection beam 4B are also increased or decreased, and the frequency of a voltage signal generated between the detection electrodes 17 and the lower electrode layer 14 is also increased or decreased. The vibration amplitude of the beams 4 is increased as the frequencies of the vibrations of the drive beam 4A and the detection beam 4B approach the resonance frequency of the beams 4. When the frequencies of the vibrations of the drive beam 4A and the detection beam 4B become the resonance frequency of the beams 4, the vibration amplitude of beam 4 becomes the greatest.

As described above, the beams 4 are configured so that the adsorption of a constitutive substance on the substance adsorption film 5 results in a variation in vibration frequency (for example, resonance frequency). In addition, the vibration frequencies of the beams 4 vary according to the degree of the adsorption of the constitutive substance on the substance adsorption film 5. As a result, the frequencies at which the vibration amplitudes of the beams 4 are the greatest also vary. Conversely, a change from a state in which the substance adsorption film 5 does not adsorb the constitutive substance to a state in which the substance adsorption film 5 adsorbs the constitutive substance can be detected by determining a variation in vibration frequency at which the amplitudes of the voltage signals of the detection electrodes 17 and the lower electrode layer 14 are the greatest.

The potential difference generated between the detection electrodes 17 and the lower electrode layer 14 becomes a voltage signal, which is output through the interelectrode signal wire 22 and the detection signal wire 23. The output voltage signal is regarded as information about the vibration frequencies of the beams 4, and variations in the vibration frequencies of the beams 4 are detected based on the information, whereby the inclusion of a substance adsorbed by the substance adsorption film 5 in gas passing through the through-holes 3 can be detected.

In the supporting substrate 2, the lower electrode layer 14 is formed on the Si active layer 12, and an insulating layer 18 is formed on the lower electrode layer 14, as illustrated in FIG. 6A and FIG. 6B. However, the lower electrode layer 14 and the insulating layer 18 are removed around each through-hole 3, as illustrated in FIG. 5. However, the lower electrode layer 14 forming the drive beam 4A and the detection beam 4B, which is not removed, is connected to the lower electrode layer 14 on the supporting substrate 2.

In addition, the lower electrode layer 14 is removed in a region S in which the drive signal wire 21 and the detection signal wire 23 are wired on the supporting substrate 2. This is because a parasitic capacitance is prevented from being generated between the drive signal wire 21 and the detection signal wire 23, and the lower electrode layer 14, thereby inhibiting the appropriate input of voltage signals into the piezoelectric layers of the drive beam 4A and the detection beam 4B.

Figure 9:
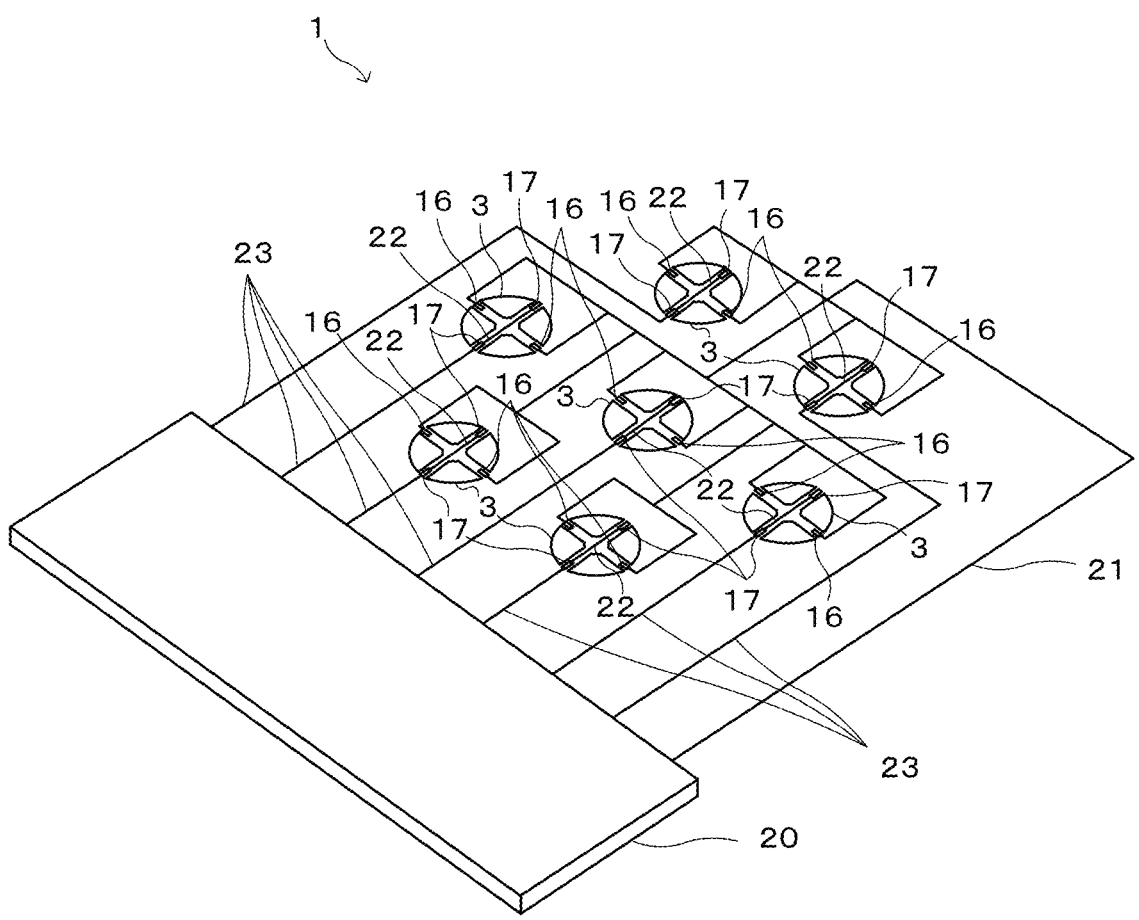
FIG. 9 is a perspective view illustrating the wiring of a substance detecting element.

As illustrated in FIG. 9, a signal processing circuit 20 is disposed in the substance detecting element 1. The signal processing circuit 20 is connected to one drive signal wire 21 and seven detection signal wires 23. The drive signal wire 21 from the signal processing circuit 20 is branched into 14 wires, which are connected to the drive electrodes 16 in the pairs of the respective through-holes 3. In other words, the drive signal wires 21 that are electrically connected to the respective drive electrodes 16 formed on both the ends of the drive beams 4A are drawn to the outside of the drive beams 4A and unified into one. In addition, the seven detection signal wires 23 from the respective through-holes 3 are independently connected to the signal processing circuit 20. The signal processing circuit 20 inputs and outputs a voltage signal on the basis of the potential of the lower electrode layer 14.

The signal processing circuit 20 outputs, for example, a sinusoidal voltage signal to the drive electrodes 16 corresponding to each through-hole 3 through the drive signal wires 21, and inputs, through the detection signal wire 23, the voltage signal output from the detection electrode 17 corresponding to each through-hole 3. The signal processing circuit 20 detects variations in the vibration frequencies (for example, resonance frequencies) of the beams 4 on the basis of the input voltage signal. In the substance detecting element 1, the adsorption of a constitutive substance can be detected, for example, in a unit of a nanogram.

In the substance detecting element 1, the beams 4 are disposed in each through-hole 3, and the kinds of the substance adsorption films 5 supported by the respective pairs of beams 4 are different. The signal processing circuit 20 inputs, through the detection signal wires 23, a voltage signal output from the detection electrodes 17 of each through-hole 3, and detects a variation in the vibration frequency of each beam 4, that is, the adsorption of a constitutive substance on the substance adsorption film 5 corresponding to the beam 4, on the basis of the input voltage signal. The signal processing circuit 20 includes a memory, and the detection result of the constitutive substance of each substance adsorption film 5 is stored in the memory.

Figure 10:
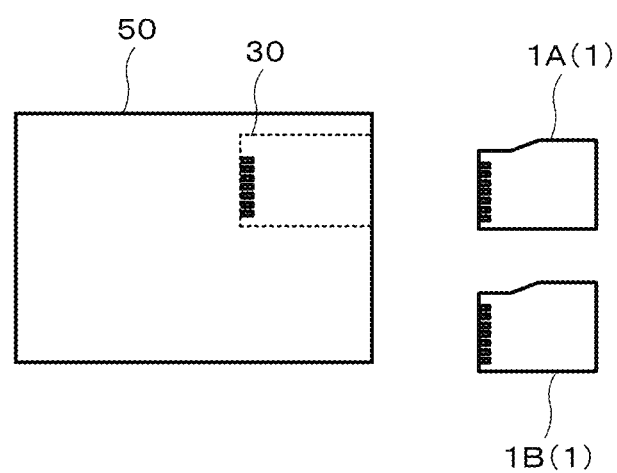
FIG. 10 is a view illustrating substance detecting elements to be inserted into an electronic instrument.

As illustrated in FIG. 10, the substance detecting element 1 according to the present embodiment includes an interface 30 for a memory card for the electronic instrument 50 such as a smartphone. It is assumed that there are substance detecting elements 1A and 1B for different specified substances to be detected, as the substance detecting elements 1.

The substance detecting element 1A is connected to the electronic instrument 50 via the interface 30. The electronic instrument 50 can read the detection result of a constitutive substance, stored in the memory of the signal processing circuit 20 of the substance detecting element 1A. The electronic instrument 50 reads the data of the memory of the signal processing circuit 20 of the substance detecting element 1A inserted into the interface 30, and analyzes a substance to be detected on the basis of the read data.

Figure 11A:
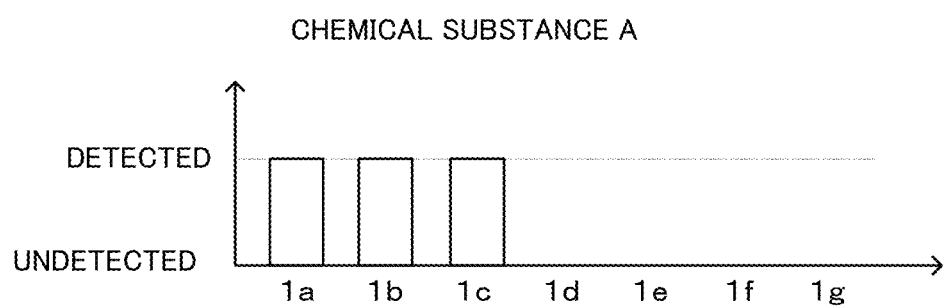
FIG. 11A is a view illustrating the reference pattern (1) of constitutive substances included in a chemical substance.
Figure 11B:
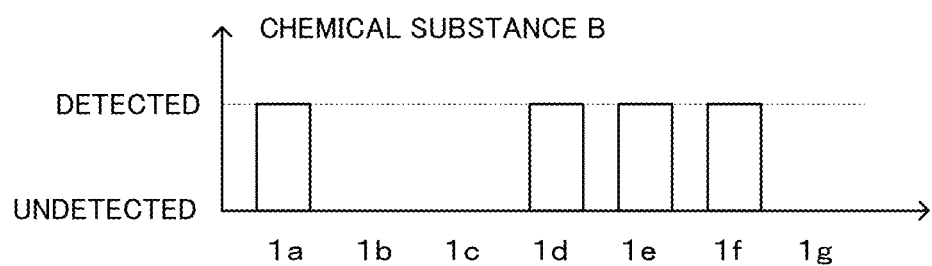
FIG. 11B is a view illustrating the reference pattern (2) of constitutive substances included in a chemical substance.

It is assumed that for example, the constitutive substances to be detected of the substance detecting element 1A are 1*a* to 1*g*. In addition, it is assumed that the constitutive substances of a certain chemical substance A are 1*a*, 1*b*, and 1*c*, and the constitutive substances of another chemical substance B are 1*a*, 1*d*, 1*e*, and 1*f*. When the chemical substance A is included in gas, the detection results of the chemical substance A indicate the detections of 1*a*, 1*b*, 1*c* as illustrated in FIG. 11A. When the chemical substance B is included in gas, the detection results of the chemical substance B indicate the detections 1*a*, 1*d*, 1*e*, and 1*f*, as illustrated in FIG. 11B. The electronic instrument 50 stores the reference patterns of the chemical substances to be detected, and performs the pattern matching of an actual detection result and the reference patterns to specify a chemical substance included in gas.

In the present embodiment, the pattern matching is performed with the patterns based on the presence or absence of the constitutive substances. However, the present disclosure is not limited thereto. It is also acceptable to determine the adsorption degree of a constitutive substance on the substance adsorption film 5 according to variations in the vibration frequencies of the beams 4, to generate a pattern according to the content ratio of the constitutive substance in a chemical substance, and to perform pattern matching with the pattern to specify the chemical substance.

Since the substance detecting elements 1A and 1B are produced by MEMS, the very small substance detecting elements 1A and 1B can be produced. Accordingly, the substance detecting elements 1A and 1B can be allowed to be in conformity with, for example, the standards of a small mini SD card. As a result, it is also possible to prepare, for example, the substance detecting elements 1A and 1B with the different combinations of the detectable constitutive substances, to replace the substance detecting element 1A with the substance detecting element 1B, as the substance detecting element 1 mounted to the electronic instrument 50, and to increase the number of the combinations of the detectable chemical substances.

Figure 12:
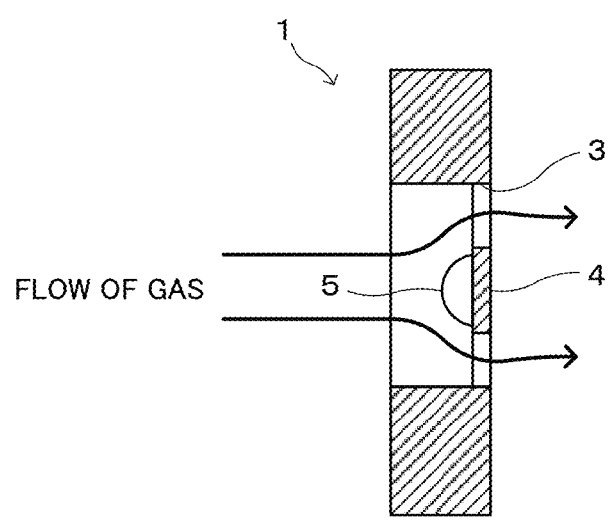
FIG. 12 is a view illustrating a state in which gas passes through a through-hole.

The substance detecting element 1 is used for detecting various chemical substances that can be included in gas. With regard to the substance detecting element 1, for example, the substance detecting element 1 is placed in the flow of gas, and is used for detecting a constitutive substance constituting a chemical substance included in the gas passing through the through-hole 3, as illustrated in FIG. 12. In such a case, the beams 4 which support the substance adsorption film 5 which adsorbs the constitutive substance do not close the whole of the through-hole 3 but close a part of the through-hole 3. Thus, the beams 4 prevent the gas including the chemical substance to be detected from remaining in the through-hole 3 to help the gas to pass through the through-hole 3.

In accordance with the present embodiment, a chemical substance can be more efficiently detected because the substance adsorption film 5 is disposed in each through-hole 3 through which gas including the chemical substance passes, and is configured so that the gas including the chemical substance to be detected easily passes through the periphery of the substance adsorption film 5, as described in detail above.

Figure 13A:
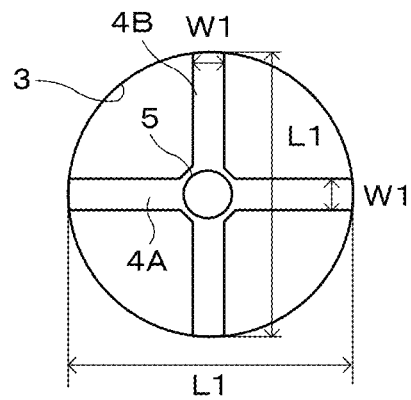
FIG. 13A is a view illustrating an alternative example (1) of a piezoelectric element formed on beams.
Figure 13B:
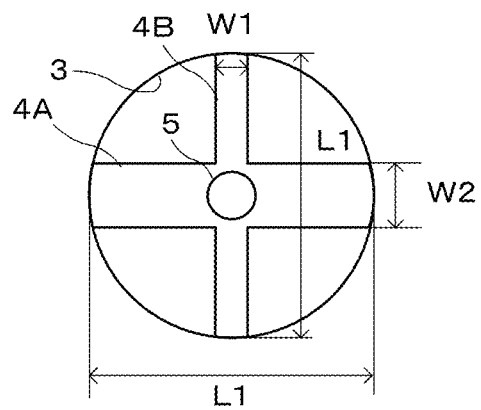
FIG. 13B is a view illustrating an alternative example (2) of the piezoelectric element formed on the beams.
Figure 13C:
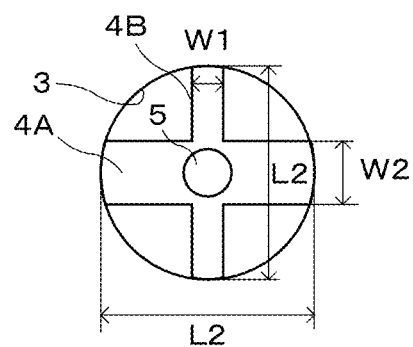
FIG. 13C is a view illustrating an alternative example (3) of the piezoelectric element formed on the beams.

In the embodiment described above, the width W1 (the length in the lateral direction) of the drive beam 4A and the width W1 (the length in the lateral direction) of the detection beam 4B are equal to each other, as illustrated in FIG. 13A. However, the present disclosure is not limited thereto. As illustrated in FIG. 13B, the width W2 of drive beam 4A may be set to be wider than the width W1 of the detection beam 4B. As illustrated in FIG. 13C, it is also acceptable to set the width of the drive beam 4A at W2 and the width of the detection beam 4B at W1, to shorten the diameter of the through-hole 3, and to shorten the length L1 of the drive beam 4A to L2. In such a manner, the vibration frequencies of all the beams 4 can be set at higher levels to reduce the influence of vibrations from the outside, and variations in the vibration frequencies of the beams 4 per unit weight of an adsorbed constitutive substance can be increased to improve the accuracy of the detection of the adsorption of the constitutive substance.

The widths and lengths of the beams 4 are desirably determined based on a relationship with respect to the size of each through-hole 3, required for the flow of gas.

In the present embodiment, each beam 4 is fixed to at least two edges of each through-hole 3. In such a manner, the beams 4 can be stably retained, and the vibration frequencies of the beams 4 can be increased, in comparison with a cantilever 4.

Figure 14A:
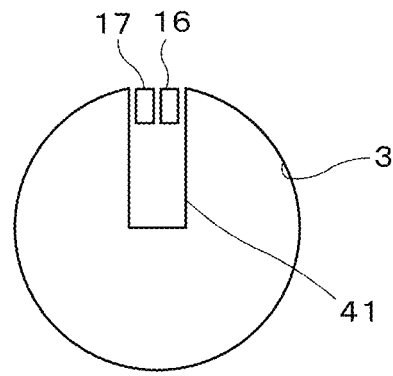
FIG. 14A is a view illustrating an alternative example (1) of a beam.

In the embodiment described above, the beams 4 are fixed to the four edges of each through-hole 3. However, the present disclosure is not limited thereto. As illustrated in FIG. 14A, a beam 41 may be a cantilever. In such a case, the vibration frequency of the beam 41 is desirably increased by increasing the width or thickness of the beam 41. A drive electrode 16 and a detection electrode 17 may be disposed together on one end of the beam 41 (one end fixed to an edge of the through-hole 3).

Figure 14B:
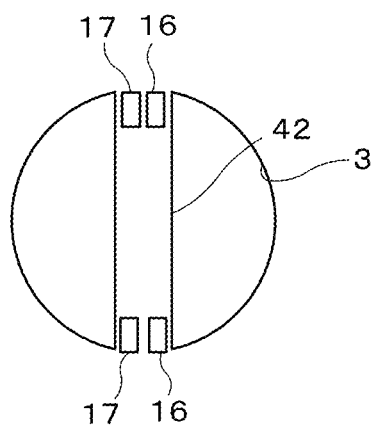
FIG. 14B is a view illustrating an alternative example (2) of a beam.

As illustrated in FIG. 14B, a beam 42 fixed to two edges of a through-hole 3 may also be used. In such a case, drive electrodes 16 and detection electrodes 17 may be disposed together on both ends of the beam 42.

Figure 14C:
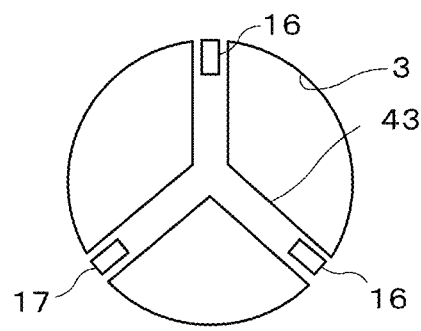
FIG. 14C is a view illustrating an alternative example (3) of a beam.

As illustrated in FIG. 14C, a beam 43 fixed to three edges of a through-hole 3 may also be used. In such a case, drive electrodes 16 in a pair may be arranged on two of the ends of the beam 43, and a detection electrode 17 may be arranged on the remainder of the ends.

In the embodiment described above, the beams 4 are configured so that the two doubly supported beams, which are the drive beam 4A and the detection beam 4B, are coupled to each other at the middles of the doubly supported beams. In such a manner, the entire beams 4 are vibrated by the one drive beam 4A, and the vibrations of the beams 4 are detected by the other detection beam 4B, whereby wire-saving can be achieved for the wiring of a circuit that drives the beams 4 and the wiring of a circuit that detects the vibrations of the beams 4.

In the embodiment described above, the drive beam 4A and the detection beam 4B are orthogonal to each other. In such a manner, the vibration of the drive beam 4A can be prevented from being inhibited by the detection beam 4B. However, the drive beam 4A and the detection beam 4B need not be orthogonal to each other but may intersect each other.

In the embodiment described above, the drive electrodes 16 are disposed on both the ends of the drive beam 4A, and the detection electrodes 17 are disposed on both the ends of the detection beam 4B. However, the present disclosure is not limited thereto. In a substance detecting element 1, a drive electrode 16 may be disposed on one end of a drive beam 4A, and a detection electrode 17 may be disposed on one end of a detection beam 4B. In other words, in the substance detecting element 1, the drive electrode 16 need not be disposed on the other end of drive beam 4A, and the detection electrode 17 need not be disposed on the other end of the detection beam 4B.

In the embodiment described above, the detection electrodes 17 are connected to each other through the interelectrode signal wire 22. In such a manner, the detection signal wires 23 drawn from the detection electrodes 17 can be unified into one, and therefore, wire-saving can be achieved on the supporting substrate 2.

In the embodiment described above, the drive signal wire 21, connected to the drive electrodes 16, is drawn to the outside, and the drive signal wire 21, from the signal processing circuit 20, is branched into the wires, which are input into the drive electrodes 16. In such a manner, the drive signal wire 21 from the signal processing circuit 20 can be unified into one, and therefore, wire-saving can also be achieved for the drive signal wire 21 connected to drive electrodes 16.

In the embodiments described above, the through-holes 3 are disposed in the supporting substrate 2, the pair of beams 4 is disposed in each through-hole 3, and the kinds of the substance adsorption films 5 supported by the respective pairs of beams 4 are different. In such a manner, a chemical substance can be specified based on the detection patterns of constitutive substances.

In the embodiment described above, the number of the through-holes 3 or the pairs of the beams 4 is seven. However, the present disclosure is not limited thereto. The number of the through-holes 3 or the pairs of the beams 4 may be six or less, or may be eight or more. The number of the through-holes 3 or the pairs of the beams 4 may depend on the number of constitutive substances to be detected.

In the embodiment described above, each through-hole 3 has a circular shape. However, the present disclosure is not limited thereto. Each through-hole may have an elliptical or rectangular shape, or may have a form of a combination of curved and straight lines.

In the embodiment described above, the substance to be detected is a chemical substance constituting an odor. However, the present disclosure is not limited thereto. For example, an odorless chemical substance included in gas may be detected.

In the embodiment described above, the chemical substance is included in gas. However, the present disclosure is not limited thereto. The present disclosure can also be applied to the detection of a substance in liquid.

In the embodiment described above, the substance detecting element 1A is produced using an SOI wafer. However, the present disclosure is not limited thereto. The substance detecting element may be produced using another wafer.

In the embodiment described above, the lower electrode layer 14 and the piezoelectric element 15 are disposed on the approximately entire surface of the beams 4. However, the present disclosure is not limited thereto. The lower electrode layer 14 and the piezoelectric element 15 may be disposed only on the portions on which the drive electrodes 16 and the detection electrodes 17 are formed.

In the embodiment described above, the detection electrodes 17 formed on both the ends of the detection beam 4B are connected to each other through the interelectrode signal wire 22. However, the present disclosure is not limited thereto. Separate detection signal wires 23 may be drawn from the detection electrodes 17, may be disposed, and may be configured to output separate voltage signals.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the priority of Japanese Patent Application No. 2017-70353, filed on Mar. 31, 2017, the entire disclosure of which is incorporated by reference herein.

INDUSTRIAL APPLICABILITY

The present disclosure can be applied to the detection of a chemical substance included in fluid.

REFERENCE SIGNS LIST 1, 1A, 1B Substance detecting element
2 Supporting substrate
3 Through-hole
4 Beam
4A Drive beam (first beam)
4B Detection beam (second beam)
5 Substance adsorption film
10 Base
11 Si supporting layer
12 Si active layer
13 Opening
14 Lower electrode layer
15 Piezoelectric element (piezo element)
16 Drive electrode
17 Detection electrode
18 Insulating layer
20 Signal processing circuit
21 Drive signal wire
22 Interelectrode signal wire
23 Detection signal wire
30 Interface
41, 42, 43 Beam
50 Electronic instrument

The invention claimed is:

1. A substance detecting element comprising:
a supporting substrate in which a through-hole is disposed; and
a plate-shaped beam that comprises a piezoelectric element, the beam extending from an edge of the through-hole toward an opposite edge to close a part of the through-hole and supporting a substance adsorption film to which a substance to be detected adheres, and the beam having a vibration frequency that is varied due to adhesion of the substance to the substance adsorption film, wherein
the beam comprises an elongated plate-shaped first beam having both ends fixed to edges of the through-hole and provided with an electrode on at least one of both the ends and an elongated plate-shaped second beam having both ends fixed to edges of the through-hole and provided with an electrode on at least one of both the ends, the second beam intersecting the first beam,
the electrode provided on the first beam applies a voltage to the piezoelectric element to vibrate and deform the beam,
the electrode provided on the second beam detects information about a vibration frequency of the beam, a width of the first beam is set to be wider than a width of the second beam, and.

2. The substance detecting element according to claim 1, wherein at least one of the first beam or the second beam is provided with the electrode on each of both the ends thereof fixed to the edges of the through-hole.

3. The substance detecting element according to claim 1, wherein
a width of a coupling portion of the first beam and the second beam is set to be wider than widths of portions of the first beam and the second beam other than the coupling portion.

4. The substance detecting element according to claim 1, wherein the first beam and the second beam are orthogonal to each other.

5. A substance detecting element comprising:
a supporting substrate in which a through-hole is disposed; and
a plate-shaped beam that comprises a piezoelectric element, the beam extending from an edge of the through-hole toward an opposite edge to close a part of the through-hole and supporting a substance adsorption film to which a substance to be detected adheres, and the beam having a vibration frequency that is varied due to adhesion of the substance to the substance adsorption film, wherein
the beam comprises an elongated plate-shaped first beam having both ends fixed to edges of the through-hole and provided with an electrode on at least one of both the ends and an elongated plate-shaped second beam having both ends fixed to edges of the through-hole and provided with an electrode on at least one of both the ends, the second beam intersecting the first beam,
the electrode provided on the first beam applies a voltage to the piezoelectric element to vibrate and deform the beam,
the electrode provided on the second beam detects information about a vibration frequency of the beam,
the electrode is formed on both the ends of one beam of the first beam or the second beam,
a lead wire is formed on the one beam, the lead wire connecting a plurality of the electrodes formed on both the ends of the one beam, and
a lead wire that is electrically connected to one electrode of the plurality of electrodes formed on both the ends of the one beam is drawn to outside of the one beam.

6. The substance detecting element according to claim 1, wherein
the electrode is formed on both the ends of one beam of the first beam or the second beam, and
lead wires that each are electrically connected to a corresponding one electrode of a plurality of the electrodes formed on both the ends of the one beam, are drawn to outside of the one beam and are unified into one.

7. A substance detecting element comprising:
a supporting substrate in which a through-hole is disposed; and
a plate-shaped beam that comprises a piezoelectric element, the beam extending from an edge of the through-hole toward an opposite edge to close a part of the through-hole and supporting a substance adsorption film to which a substance to be detected adheres, and the beam having a vibration frequency that is varied due to adhesion of the substance to the substance adsorption film, wherein
a plurality of the through-holes is disposed in the supporting substrate, each of the plurality of the through-holes is provided with the beam, and each beam supports a different kind of the substance adsorption film.

8. The substance detecting element according to claim 1, wherein the first beam and the second beam are coupled to each other at respective middles of the first beam and the second beam.

9. A substance detecting element comprising:
a supporting substrate in which a through-hole is disposed; and
a plate-shaped beam that comprises a piezoelectric element, the beam extending from an edge of the through-hole toward an opposite edge to close a part of the through-hole and supporting a substance adsorption film to which a substance to be detected adheres, and the beam having a vibration frequency that is varied due to adhesion of the substance to the substance adsorption film, wherein
a plurality of the through-holes is disposed in the supporting substrate,
a plurality of the beams is disposed,
the through-holes are provided with the respective beams, and
the through-holes include through-holes that have mutually different hole sizes.

10. The substance detecting element according to claim 1, wherein the electrode provided on the first beam and the electrode provided on the second beam are each formed to straddle a corresponding edge of the through-hole.

11. The substance detecting element according to claim 1, wherein
the second beam is provided with the electrode on each of both the ends thereof fixed to the edges of the through-hole, and
one electrode of a plurality of the electrodes formed on both the ends of the second beam is connected to a lead wire drawn to outside of the second beam.

* * * * *

UNITED STATES PATENT AND TRADEMARK OFFICE
CERTIFICATE OF CORRECTION

| | | |
|---|---|---|
| PATENT NO. | : 11,448,619 B2 | |
| APPLICATION NO. | : 16/483344 | |
| DATED | : September 20, 2022 | |
| INVENTOR(S) | : Kenji Ogata and Shogo Kurogi | |

It is certified that error appears in the above-identified patent and that said Letters Patent is hereby corrected as shown below:

In the Claims

Column 13, Line 2: Claim 1 delete "of the second beam, and." and replace with -- of the second beam. --

Signed and Sealed this
Thirty-first Day of January, 2023

Katherine Kelly Vidal
*Director of the United States Patent and Trademark Office*